United States Patent [19]

Harvey, III et al.

[11] Patent Number: 5,686,360

[45] Date of Patent: Nov. 11, 1997

[54] PASSIVATION OF ORGANIC DEVICES

[75] Inventors: Thomas B. Harvey, III, Scottsdale; Song Q. Shi, Phoenix; Franky So, Tempe, all of Ariz.

[73] Assignee: Motorola, Schaumburg, Ill.

[21] Appl. No.: 565,124

[22] Filed: Nov. 30, 1995

[51] Int. Cl.⁶ ........................................ H01L 21/60
[52] U.S. Cl. ........................ 437/211; 437/209; 437/215
[58] Field of Search ............................. 437/209, 211, 437/214, 215, 217, 219, 220

[56] References Cited

U.S. PATENT DOCUMENTS

| | | | |
|---|---|---|---|
| 5,061,657 | 10/1991 | Queen et al. | 437/211 |
| 5,315,129 | 5/1994 | Forrest et al. | 257/40 |
| 5,424,560 | 6/1995 | Norman et al. | 257/40 |
| 5,482,896 | 1/1996 | Tang | 437/209 |
| 5,532,550 | 7/1996 | Adler | 313/500 |
| 5,587,589 | 12/1996 | So et al. | 257/40 |

*Primary Examiner*—Kevin Picardat
*Attorney, Agent, or Firm*—Eugene A. Parsons

[57] ABSTRACT

A method of passivating organic devices positioned on a supporting transparent plastic substrate including the steps of overcoating the plastic substrate with a multi-layer overcoating, composed of alternating layers of a transparent polymer film and a transparent dielectric material, forming an organic device on the overcoated transparent plastic substrate and sealing the organic device formed on the overcoated plastic substrate. The polymer film layer used in overcoating the plastic substrate acts as a means of improving the barrier properties of the multi-layer overcoating and the dielectric material acts as a physical barrier to atmospheric elements which can corrode the organic device and are a detriment to the reliability of organic LEDs.

15 Claims, 4 Drawing Sheets

PASSIVATION OF ORGANIC DEVICES

FIELD OF THE INVENTION

The present invention pertains to organic devices and more specifically to the formation of passivated organic devices on plastic substrates.

BACKGROUND OF THE INVENTION

At the present time devices utilizing organic displays, such as polymer light emitting devices, are potential candidates for a great variety of virtual and direct view type displays, such as digital watches, telephones, lap-top computers, pagers, cellular telephones, calculators and the like. Unlike, inorganic semiconductor light emitting devices, organic light emitting device are generally simple and relatively easy and inexpensive to fabricate. Also, a variety of colors and large-area devices are easily attained.

Conventional organic LEDs are built on glass substrates because of the low permeability of glass to oxygen and water vapors. This and other forms of degradation, are a detriment to the overall reliability of organic LEDs. It is proposed in the present invention to utilize plastic as a supporting substrate for the formation of organic LEDs. Traditionally plastic is susceptible to the permeation of oxygen and moisture to some extent. In the instance where the organic LED is formed on a plastic substrate, there presents the need to reduce and eliminate the diffusion of oxygen and moisture through the plastic substrate which, as previously stated, leads to degradation of the organic LED. Furthermore, additional organic components of the LED may also be subject to adverse reactions with oxygen or water.

In general, a two-dimensional organic LED array for image manifestation apparatus applications as known in the art is composed of a plurality of organic LEDs (one or more of which form a pixel) arranged in rows and columns. Each individual organic LED in the array is generally constructed with a light transmissive first electrode, an organic electroluminescent medium deposited on the first electrode, and a metallic electrode on top of the organic electroluminescent medium. In forming an organic LED, generally a layer of reactive metal is utilized as a cathode to ensure efficient electron injecting electrodes and low operating voltages. However, in the formation of organic LEDs on a plastic substrate, not only is the substrate susceptible to the permeation of oxygen and moisture, but the reactive metals are also susceptible to oxygen and moisture, especially during operation, since oxidation of the metal limits the lifetime of the devices. A hermetic seal about the array itself is normally required to achieve long term stability and longevity. In hermetically sealing the array, several types of hermetic seals are utilized, the most common of which are inorganic materials, such as metals and the like. Accordingly, when forming the organic LED on a plastic substrate, the permeation of oxygen and water vapors to the organic LED must be stopped by hermetically sealing the plastic substrate from the organic LED and by hermetically sealing the array itself.

A further problem that occurs in the fabrication and passivation of organic devices is a result of the fact that the organic layers of the organic devices can not withstand very high temperatures (i.e. generally greater than approximately 100° C.). In many instances, even approaching the critical temperatures of the organic layers, especially if the elevated temperatures are maintained for relatively long periods of time, can degrade the organic materials and reduce the reliability and/or the longevity.

In the formation of organic LEDs, several types of hermetic seals for sealing the array itself are utilized to protect the organic device from oxygen and water vapors. As previously stated, the most common of the hermetic seals utilized today are comprised of inorganic materials, such as metal cans or metallized plastic sealers. These types of seals are very expensive to fabricate and require extensive labor to assemble. In addition, metal cans are large and heavy so that they severely limit the applications of organic devices.

A more recent means of hermetically sealing organic devices is to overcoat them with an inorganic material, such as a ceramic, dieletric or metal, to achieve a hermetic seal about the organic device. However, the organic devices are very susceptible to the high temperatures normally required in the deposition of these materials. Thus, the ceramic, dielectric or metal material generally must be deposited by PECVD methods in order to meet the low temperature criteria. The major problem with this method of sealing is that during the PECVD deposition there is a strong possibility of radiation damage to the organic device.

Accordingly, it is highly desirable to devise a relatively inexpensive and convenient method of forming organic devices on a plastic substrate in which there exist a first hermetic seal between the plastic substrate and the ambient atmosphere to protect the plastic substrate from the permeation of oxygen, moisture and other atmospheric elements, thereby damaging the organic LED, and a second hermetic seal about the array of organic devices to protect it from damage by similar atmospheric elements.

It is a purpose of the present invention to provide a new and improved method for overcoating plastic substrates to prevent the permeation therethrough of oxygen and moisture.

It is another purpose of the present invention to provide a new and improved method of forming a passivating organic device on a plastic substrate.

It is a still further purpose of the present invention to provide a new and improved method of forming a passivating organic device on a plastic substrate which is relatively convenient and inexpensive to perform.

SUMMARY OF THE INVENTION

The above problems and others are at least partially solved and the above purposes and others are realized in a method of forming organic devices positioned on a supporting transparent plastic substrate including the step of depositing a multi-layer overcoating on the plastic substrate. The multi-layer overcoating is composed of thin alternating layers of a robust transparent polymer film and a transparent inorganic material such as silicon monoxide, silicon oxide, silicon dioxide or silicon nitride, which are deposited on at least one planar surface of the plastic substrate. The multi-layer overcoating is deposited on at least one planar surface of the plastic substrate and the organic LED is formed thereon. Alternatively, the multi-layer overcoating is deposited on all planar surfaces of the plastic substrate thereby encapsulating the plastic substrate in the alternating layers of the transparent inorganic material and the polymer film prior to forming the organic LED thereon. This multi-layer overcoating serves to reduce and eliminate the diffusion of oxygen and moisture through the plastic substrate, thereby damaging the organic LED formed thereon.

In a preferred embodiment the polymer film layer and the inorganic dielectric material layer each rely on a different mechanism for protection against permeation of oxygen and moisture through the plastic substrate. The polymer film layer is used as a means of improving the barrier properties of the multi-layer overcoating and aids in slowing the diffusion of moisture and oxygen through the plastic substrate. It is preferably formed from a transparent polymer chosen from a group of fluorinated polymers, parylenes, and cyclotenes. The transparent dielectric layer is used as a physical barrier to stop the diffusion of moisture and oxygen through the plastic substrate. It is preferably formed from a transparent dielectric layer of silicon monoxide, silicon oxide, silicon dioxide or silicon nitride. In combination, the polymer film layer and the transparent dielectric layer serve to provide a barrier to oxygen and moisture, thereby protecting against damage to the organic LEDs. The transparent polymer film layer and the transparent dielectric layer in combination form the multi-layer hermetic sealing layer for the plastic substrate of the present invention. To protect the plastic substrate from the penetration of moisture and oxygen, the preferred embodiment is composed of at least two layers of the multi-layer overcoating, comprised of alternating layers of the polymer film layer and the transparent dielectric layer. It should be understood that it is disclosed to use fewer than two layers of the multi-layer overcoating, or any combination of the layers comprising the multi-layer overcoating but with less favorable results.

BRIEF DESCRIPTION OF THE DRAWINGS

Referring to the drawings.

DESCRIPTION OF THE PREFERRED EMBODIMENTS

It should be understood that the drawings are necessarily of a schematic nature, since the thicknesses of the individual layers are too thin to permit depiction to scale or to permit convenient proportionate scaling. Referring specifically to the drawings, wherein like characters indicate like parts throughout the figures, FIGS. 1 and 2 are simplified cross-sectional views of an organic LED array illustrating formation of an organic LED 10 on an overcoated transparent plastic substrate in accordance with the present invention.

Figure 1:
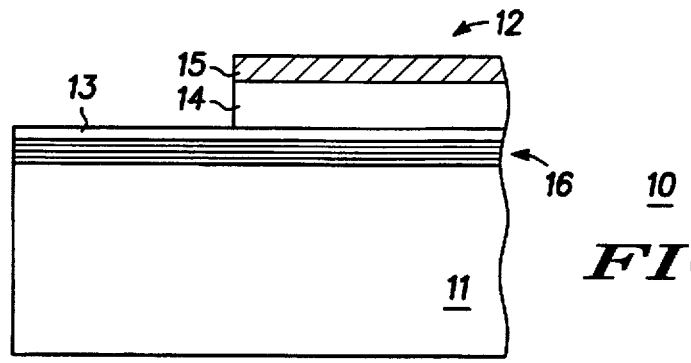
FIGS. 1 and 2 are simplified cross-sectional views of an organic LED array formed on an overcoated transparent plastic substrate in accordance with the present invention.
Figure 2:
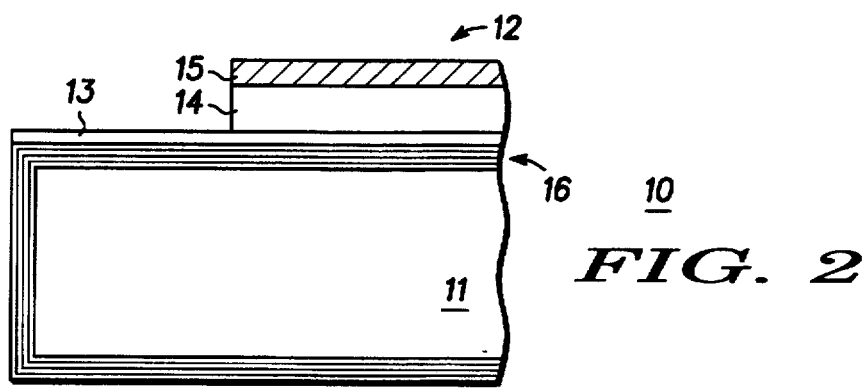

Referring specifically to FIG. 1, a substrate 11 is illustrated which is, in this specific embodiment, formed from an optically clear plastic. An array 12 of pixels of organic light emitting devices (LEDs) is positioned on substrate 11, generally by fabricating array 12 on a multi-layer overcoating 16 (to be discussed presently) deposited on an upper planar surface of substrate 11, in any of the various methods of fabricating organic LEDs. As a specific example, array 12 includes a transparent layer 13 of conductive material, such as indium-tin-oxide (ITO) or the like, with an active organic layer 14, such as an organic electroluminescent layer, positioned thereon and a cathode 15 formed of a metal layer including a thin layer of a low work function metal. Organic layer 14 is generally comprised of a hole transport layer, an emitting layer and an electron transport layer. Array 12 of organic LEDs, and especially the layer of reactive metal, is susceptible to oxygen and moisture in the surrounding atmosphere and must, therefore, be passivated to provide reliability and a reasonable longevity.

As previously stated, array 12 is formed on plastic substrate 11. In that the permeation of oxygen and water vapor is inherent to plastic, a hermetic multi-layer overcoating 16 must be deposited on substrate 11 to protect array 12 formed thereon. To reduce and eliminate the diffusion of oxygen and moisture through plastic substrate 11, multi-layer overcoating 16 is comprised of at least two alternating layers of a polymer film 17 and a transparent dielectric material 18 (as illustrated in FIG. 3), deposited on substrate 11.

The deposition of the multi-layer overcoating 16 must be in a positional manner so as to prevent the permeation of oxygen or moisture through the plastic substrate 11, thereby damaging the organic LED. Accordingly, multi-layer overcoating 16 may be deposited on an uppermost or lower planar surface of substrate 11 or alternatively, on all planar surfaces of substrate 11, thereby encapsulating substrate 11 with multi-layer overcoating 16. As illustrated in FIG. 1, multi-layer overcoating 16 is deposited on an uppermost planar surface of substrate 11, positioned between substrate 11 and transparent layer 13 of conductive material of array 12. Alternative embodiments disclose multi-layer overcoating 16 as deposited on a lower planar surface of plastic substrate 11, having array 12 formed directly on the uppermost surface of substrate 11 (not shown), or as illustrated in FIG. 2, multi-layer overcoating 16, deposited on a plurality of planar surfaces comprising substrate 11 so as to completely encapsulate substrate 11. The addition of multi-layer overcoating 16 to the formation of the array 12 of organic LED 10 allows for the formation of the organic LED 10 on plastic substrate 11.

Figure 3:
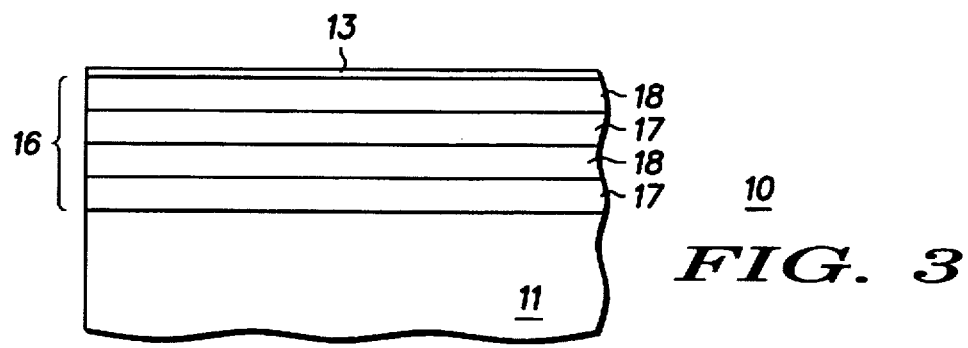
FIG. 3 is a greatly enlarged and simplified cross-sectional view of an overcoated transparent plastic substrate, further illustrating the alternating multi-layer overcoating of the plastic substrate on an uppermost planar surface in accordance with the present invention.

As previously stated and as illustrated in FIG. 3, multi-layer overcoating 16 is comprised of alternating layers of transparent polymer film 17 and transparent dielectric material layer 18. The preferred embodiment has included at least two layers of polymer film 17 and dielectric material layer 18 formed in combination. It is understood that alternating layers in reverse to those illustrated, are anticipated by this disclosure. In application, polymer film layer 17 is provided to improve the barrier properties of multi-layer overcoating 16, thereby slowing the diffusion of moisture and oxygen permeation through plastic substrate 11. The polymers which may be used in the formation of polymer film layer 17 are chosen from a group of robust polymers, such as fluorinated polymers, parylenes and cyclotenes. Polymer film layer 17 may be applied through a process of dipping substrate 11, a spin-coating process, sputtering process or by evaporative coating of substrate 11. Dielectric material layer 18 is used as a physical barrier to stop the diffusion of moisture vapor and oxygen through substrate 11, thereby damaging organic LED device 10. Dielectric material layer 18 is preferably formed from one of silicon monoxide (SiO), silicon oxide (SiOx), silicon dioxide ($SiO_2$) or silicon nitride ($Si_3N_4$) and is applied to substrate 11 in alternating layers with the polymer film layer 17 by thermal evaporation, sputtering or PECVD methods.

Figure 4:
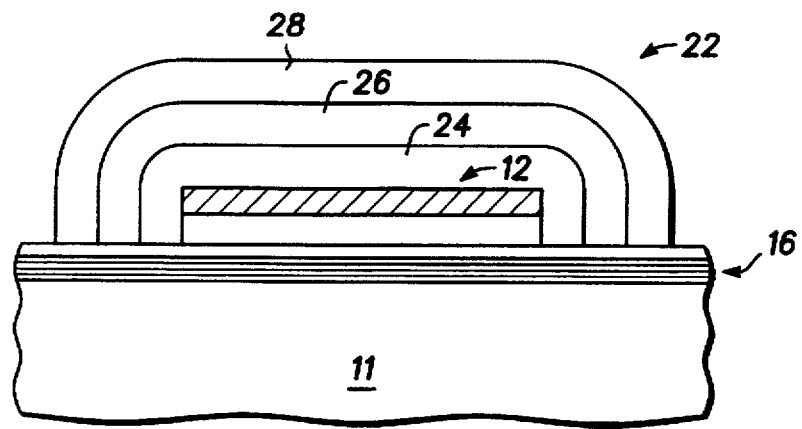
FIGS. 4 and 5 are simplified cross-sectional views of an organic LED array on an overcoated transparent plastic substrate in accordance with the present invention, illustrating hermetic sealing of the organic device with a plurality of layers deposited on the organic device.
Figure 5:
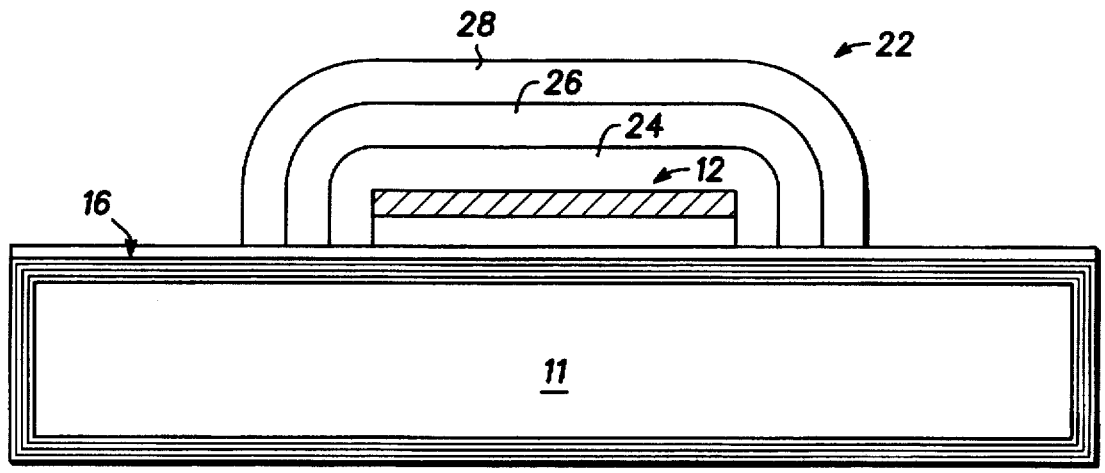

A first embodiment of an organic LED device 20 in accordance with the present invention, having a hermetic seal comprised of a plurality of layers deposited on the organic LED and further formed on a multi-layer overcoated plastic substrate 11 are illustrated in FIGS. 4 and 5. Array 12 is formed on plastic substrate 11 having deposited thereon, multi-layer overcoating 16 comprised of alternating multiple layers of polymer film layer 17 and dielectric material layer 18, previously described. As illustrated in FIG. 4, multi-layer overcoating 16 is deposited on the uppermost surface of substrate 11. As illustrated in FIG. 5, an alternative embodiment has multi-layer overcoating 16 deposited on all planer surfaces of substrate 11, thereby encapsulating substrate 11 and providing greater protection of substrate 11.

In forming the hermetic seal of array 12 of device 20, array 12 is overcoated with a hermetic sealing system 22, comprised of a buffer system designed to generally match at least some of the characteristics of array 12 to an encapsulating system. In this specific example hermetic sealing system 22, comprised of a plurality of layers, includes a first buffer layer 24 of organic material which generally serves to protect array 12. Buffer layer 24 may be either an organic polymer or an organometallic complex. Typical organic polymers which may be conveniently utilized are parylenes, and the like.

These polymers (i.e. parylenes and the like) have low coefficients of thermal expansion (CTE), close to the CTE of array 12 so that there is little or no stress created during thermal cycling. Also, both of these polymers have low dielectric constants and low permeability to oxygen and moisture.

In an example incorporating organometallic complexes as buffer layer 24, rather than organic polymers, a layer of tris(8-quinolinolato) aluminum (Alq) or the like is deposited over array 12. Since many organic devices utilize Alq in the active layers (as an emitter and/or electron transport material), this material may be uniquely matched to array 12 and it may be convenient to add buffer layer 24 to array 12 without requiring additional materials and equipment. As will be understood by those skilled in the art, other materials utilized in the active layers of specific arrays of organic devices may be utilized in buffer layer 24.

Buffer layer 24 is covered or coated with a thermal coefficient matching layer 26, which is a second layer in the buffer system. Next, thermal coefficient matching layer 26 is overcoated by depositing a low permeability inorganic layer 28 over thermal coefficient matching layer 26. Some typical examples of thermal coefficient matching layer 26 and inorganic layer 28 are listed below. Silicon dioxide ($SiO_2$) is utilized as thermal coefficient matching layer 26 and silicon nitride ($Si_3N_4$) is utilized as inorganic layer 28. In a somewhat different embodiment, a low work function metal, such as lithium (Li) or magnesium (Mg), is utilized as thermal coefficient matching layer 26 and further acts as a gettering material to absorb some trapped gases and the like within the inorganic layer. In this example, a stable metal, such as aluminum (Al) or indium (In) is utilized as inorganic layer 28 in conjunction with a dielectric media (not shown) positioned so as to isolate inorganic layer 28, composed of stable metal, thereby preventing shorting of array 12. In this example, inorganic layer 28 has a low permeability so as to completely encapsulate, or hermetically seal, array 12. For additional information on hermetically sealing array 12 through the use of a plurality of layers, see copending U.S. patent application entitled "PASSIVATION OF ORGANIC DEVICES", Ser. No. 08/431,996, filed May 1, 1995 and assigned to the same assignee.

Figure 6:
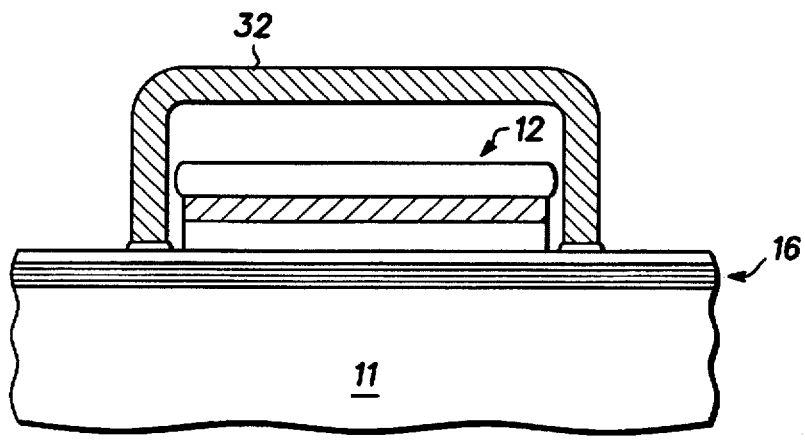
FIGS. 6 and 7 are simplified cross-sectional views of an organic LED array formed on an overcoated transparent plastic substrate in accordance with the present invention, further illustrating hermetic sealing of the organic device with a metal can.
Figure 7:
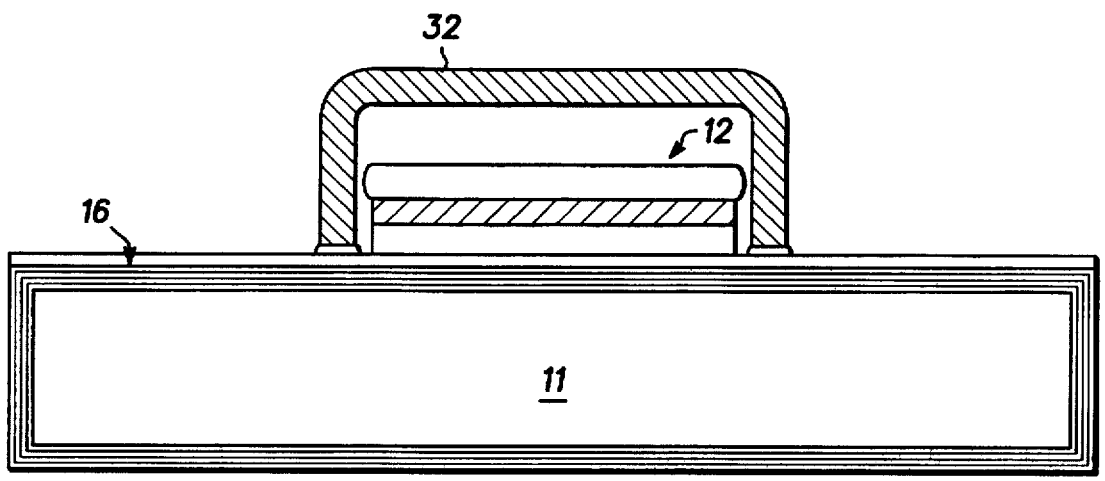

A second embodiment of an organic LED device 30 in accordance with the present invention, having a hermetic seal comprised of a metal can 32 encapsulating the organic LED, and further formed on multi-layer overcoated plastic substrate 11 is illustrated in FIGS. 6 and 7. As illustrated, array 12 is formed on a plastic substrate 11 having deposited thereon, multi-layer overcoating 16 previously described. As illustrated in FIG. 6, multi-layer overcoating 16 is deposited on the uppermost surface of substrate 11. As illustrated in FIG. 7, an alternative embodiment has multi-layer overcoating 16 encapsulating substrate 11. In forming the hermetic seal of array 12, array 12 is enclosed by metal can 32, as is well known in the art, thereby protecting organic LED device 30 from damaging atmospheric elements.

Figure 8:
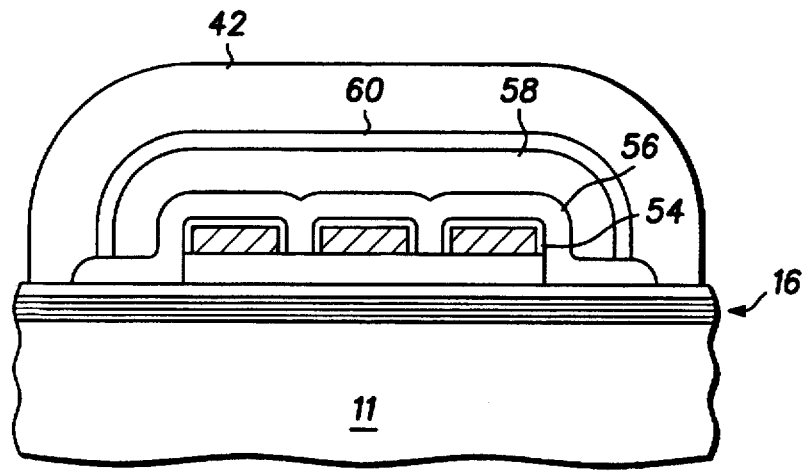
FIGS. 8 and 9 are simplified cross-sectional views of an organic LED array formed on an overcoated transparent plastic substrate in accordance with the present invention, illustrating hermetic sealing of the organic device with a glob top epoxy encapsulant.
Figure 9:
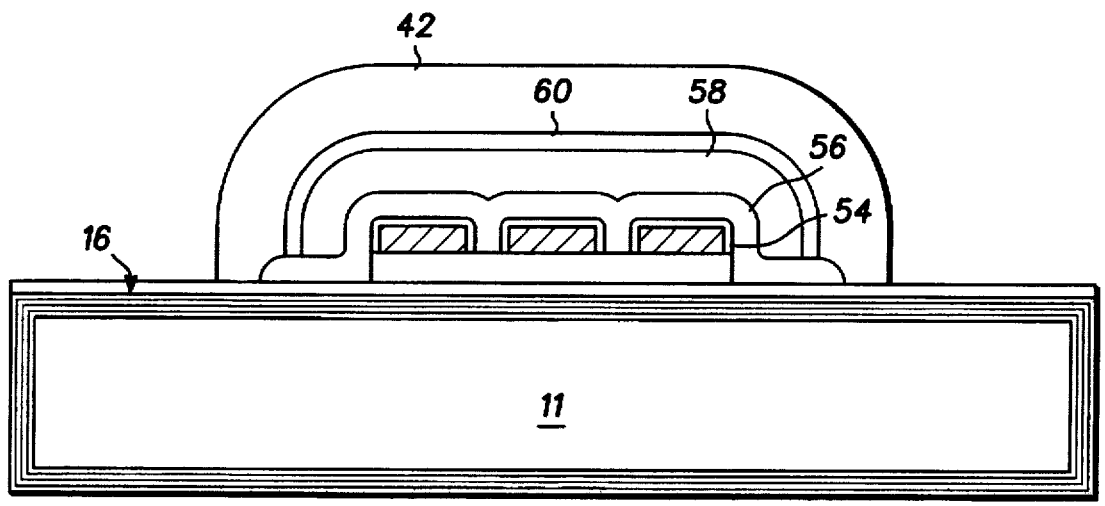
Figure 10:
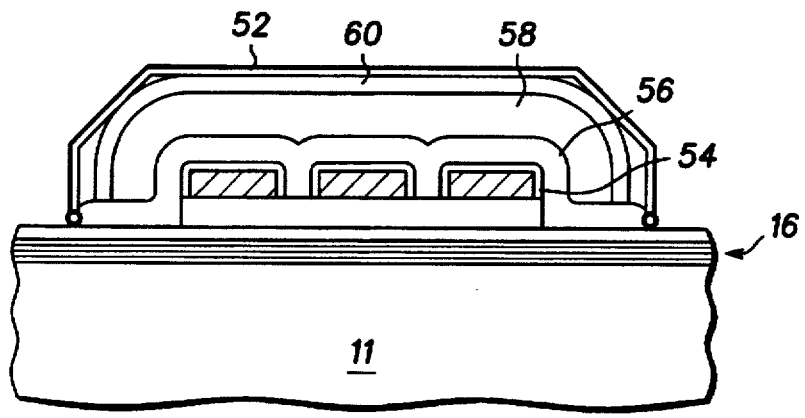
FIGS. 10 and 11 are simplified cross-sectional views of an organic LED array formed on an overcoated transparent plastic substrate in accordance with the present invention, further illustrating hermetic sealing of the organic device with a polymer laminated metal foil layer.
Figure 11:
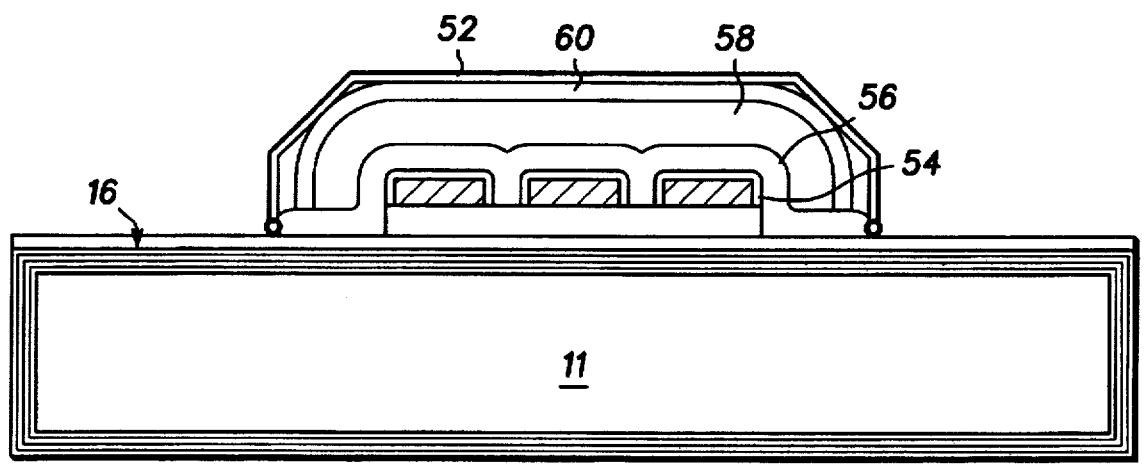

Third and fourth embodiments of an organic LED device designated 40 and 50 respectively, in accordance with the present invention, having a hermetic seal formed from a plurality of layers deposited on the organic LED, further formed on overcoated plastic substrate 11 are illustrated in FIGS. 8-11. This alternative method for passivating organic LEDs is disclosed in a copending U.S. Patent application entitled "PASSIVATION OF ORGANIC DEVICES", filed of even date herewith and assigned to the same assignee. As illustrated in FIGS. 8-11, array 12 is formed on substrate 11 having deposited thereon, multi-layer overcoating 16. As illustrated in FIGS. 8 and 10, multi-layer overcoating 16 is deposited on the uppermost surface of substrate 11 (as previously described). As illustrated in FIGS. 9 and 11, alternative embodiments have multi-layer overcoating 16 encapsulating substrate 11 (as previously described). In forming the hermetic seal of array 12 of FIGS. 8-11, the individual pixels which make up array 12 are first capped or overcoated with a layer of stable metal 54 such as indium (In) or the like. This capping or overcoating serves as the initial protective coating for the individual pixels which make up array 12.

Next, array 12, capped with the layer of stable metal 54, is overcoated in generally the same layering technique as described for previous embodiments of the present invention, illustrated as FIGS. 4 and 5. A first buffering system 56 is deposited on array 12, followed by a thermal coefficient matching layer 58. Next, thermal coefficient matching layer 58 is overcoated by depositing a low permeability inorganic layer 60 over thermal coefficient matching layer 58.

Array 12 is finally sealed with a layer of epoxy encapsulant 42 or a layer of polymer laminated metal foil 52. Shown in FIGS. 8 and 9, is an embodiment of the preferred passivated organic device, wherein the organic LED array 12 is sealed with a glob top epoxy encapsulant 42. Organic LED array 12 in an alternative embodiment is sealed with a polymer laminated metal foil 52 as illustrated in FIGS. 10 and 11.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of passivating organic devices comprising the steps of:

overcoating a transparent plastic supporting substrate, comprised of a plurality of planar surfaces, with alternating layers of at least one transparent polymer film layer and at least one transparent dielectric material layer;

providing an organic device on the overcoated transparent plastic supporting substrate defining a plurality of pixels; and sealing the organic device provided on the transparent plastic supporting substrate.

2. A method of passivating organic devices as claimed in claim 1 wherein the at least one polymer film layer is comprised of at least one of fluorinated polymers, parylenes or cyclotenes.

3. A method of passivating organic devices as claimed in claim 1 wherein the at least one polymer film layer is comprised of TEFLON-AF.

4. A method of passivating organic devices as claimed in claim 1 wherein the at least one transparent dielectric material layer is comprised of at least one of silicon monoxide, silicon oxide, silicon dioxide or silicon nitride.

5. A method of passivating organic devices as claimed in claim 1 wherein the step of overcoating the plastic substrate is further comprised of depositing the alternating layers of the at least one polymer film layer and the at least one dielectric material layer on at least one planar surface of the plurality of planar surfaces of the plastic substrate.

6. A method of passivating organic devices as claimed in claim 1 wherein the step of overcoating the plastic substrate is further comprised of the step of depositing the alternate layers of the at least one polymer film layer and the at least one dielectric material layer on the plurality of planar surfaces of the plastic substrate, thereby encapsulating the plastic substrate.

7. A method of passivating organic devices as claimed in claim 1 wherein the step of sealing the organic device provided on the plastic substrate is comprised of the steps of overcoating the organic device with a buffer system including a buffer layer of organic material positioned on the organic device and depositing a low permeability inorganic layer over the buffer system.

8. A method of passivating organic devices as claimed in claim 7 wherein the step of sealing the organic device provided on the plastic substrate includes the step of depositing a thermal coefficient matching layer on buffer layer as a portion of the buffer system.

9. A method of passivating organic devices as claimed in claim 7 wherein the step of sealing the organic device provided on the plastic substrate further includes the step of capping the plurality of pixels with a layer of stable metal.

10. A method of passivating organic devices as claimed in claim 7 wherein the step of sealing the organic device provided on the plastic substrate further includes the step of sealing the organic device by depositing a layer of epoxy encapsulant over the buffer system.

11. A method of passivating organic devices as claimed in claim 7 wherein the step of sealing the organic device provided on the plastic substrate further includes depositing a layer of polymer coated metal foil over the buffer system.

12. A method of passivating organic devices as claimed in claim 1 wherein the step of sealing the organic device provided on the overcoated plastic substrate further includes depositing alternating layers of at least one polymer and at least one metal over the organic device.

13. A method of passivating organic devices as claimed in claim 1 wherein the step of sealing the organic device provided on the overcoated plastic substrate further includes forming at least one of a metal can encapsulant or a metallized plastic encapsulant over the organic device.

14. A method of passivating organic devices comprising the steps of:

overcoating a transparent plastic substrate, comprised of a plurality of planar surfaces, with alternating layers of a polymer, comprised of at least one of fluorinated polymers, parylenes, or cyclotenes, and a transparent dielectric material, comprised of at least one of silicon monoxide, silicon oxide, silicon dioxide or silicon nitride;

providing an array of organic LEDs on the overcoated plastic supporting substrate defining a plurality of pixels; and sealing the organic device provided on the plastic substrate with at least one of a metal can encapsulant, a metallized plastic encapsulant, an epoxy encapsulant or polymer laminated metal foil.

15. A method of passivating organic devices as claimed in claim 14 further including the steps of overcoating the plurality of pixels with a layer of stable metal, overcoating the layer of stable metal with a buffer layer of one of an organic polymer or an organometallic complex, depositing a thermal coefficient matching layer of active metal on the buffer layer, and depositing a low permeability inorganic layer of stable metal over the thermal coefficient matching layer.

\* \* \* \* \*